(12) United States Patent
Houston et al.

(10) Patent No.: US 7,027,346 B2
(45) Date of Patent: Apr. 11, 2006

(54) BIT LINE CONTROL FOR LOW POWER IN STANDBY

(75) Inventors: Theodore W. Houston, Richardson, TX (US); Xiaowei Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 75 days.

(21) Appl. No.: 10/337,069

(22) Filed: Jan. 6, 2003

(65) Prior Publication Data
US 2004/0130960 A1   Jul. 8, 2004

(51) Int. Cl.
*G11C 7/00* (2006.01)
(52) U.S. Cl. ................... 365/229; 365/189.09
(58) Field of Classification Search ............... 365/154, 365/156, 189.09 X, 203, 205, 229 O
See application file for complete search history.

(56) References Cited

U.S. PATENT DOCUMENTS

| | | | | |
|---|---|---|---|---|
| 4,507,759 A | * | 3/1985 | Yasui et al. | 365/154 |
| 4,730,276 A | * | 3/1988 | Waller | 365/189.09 |
| 5,202,854 A | * | 4/1993 | Koike | 365/203 |
| 5,699,305 A | * | 12/1997 | Kawashima | 365/190 |
| 6,333,874 B1 | * | 12/2001 | Yamauchi | 365/189.09 |
| 6,504,784 B1 | * | 1/2003 | Kokubo | 365/229 |
| 6,522,594 B1 | * | 2/2003 | Scheuerlein | 365/206 |
| 2001/0038552 A1 | * | 11/2001 | Ishimaru | 365/181 |
| 2004/0090820 A1 | * | 5/2004 | Pathak et al. | 365/154 |

OTHER PUBLICATIONS

Theodore W. Houston, "Memory Array and Wordline Driver Supply Voltage Differential in Standby" U.S. Appl. No. 10/185,380, Filed Jun. 28, 2002.
Xiaowei Deng, et al., "A Low Leakage SRAM Scheme" U.S. Appl. No. 10/349,277, Filed Jan. 22, 2003.

* cited by examiner

*Primary Examiner*—Van Thu Nguyen
(74) *Attorney, Agent, or Firm*—Rose Alyssa Keagy; W. James Brady, III; Frederick J. Telecky, Jr.

(57) ABSTRACT

The present invention achieves technical advantages as embodiments of an SRAM cell (20, 30) having the bit line voltage (BLB/BLB) controlled during standby, such as allowing the bit line to float allowing the bit line voltage to be established by balance of leakage currents to the minimum leakage through the bit line. Advantageously, a controller (22, 32) also controls voltages of supplies Vdd, Vss and the n-well ($V_{nwell}$) voltage. The controller reduces a voltage differential between the supply voltage Vdd and voltage Vss in the standby mode. In one embodiment, the bit line may be tied to the reference voltage Vss, and a time delay may be introduced to reduce the possibility of using more charge in switching than that saved.

19 Claims, 3 Drawing Sheets

BIT LINE CONTROL FOR LOW POWER IN STANDBY

FIELD OF THE INVENTION

The present invention is generally related to SRAM memory cells, and more particularly to improved SRAM cell designs reducing cell current leakage in the standby mode.

BACKGROUND OF THE INVENTION

There is a need to minimize memory leakage current IDDQ in the standby mode. With the bit line in the conventional bit line-high precharge state, there is current leakage from the bit line to the word line through the gate oxide of the pass gate, as well as bit line current leakage to the low side of associated memory cells through the subthreshold leakage of the pass gate. This is illustrated in FIG. 1 as a conventional SRAM cell 10 with bias conditions to the bit line BLT/BLB of the standard design 10.

Bit line current leakage to the substrate through a parasitic diode and GIDL is typically negligible in SRAM leakage, and hence will not be mentioned hereafter.

If the bit line voltage were lowered relative to Vdd, there would also be leakage from the high side of the cell 10 to the bit line through the associated pass gate. Thus, neglecting gate current and the non-linearities of subthreshold current with Vds, there would not be an advantage to lowering the bit line voltage to reduce leakage. Also, since the cell 10 is more subject to upset from a pull-down than a pull-up state, because the load transistor is weaker than the drive transistor, the conventional approach has been to keep bit lines at Vdd in standby.

However, the gate current is increasingly important at scaled technology nodes, and the subthreshold current is non-linear with Vds. Thus, IDDQ can be lowered by lowering the bit line voltage in the standby mode. Care must be taken such that anything done to reduce bit line leakage does not result in cell up-sets or in increased leakage in associated circuits, such as in sense amplifiers.

SUMMARY OF THE INVENTION

The present invention and embodiments thereof achieve technical advantages as an SRAM cell having the bit line floated during standby, allowing the bit line voltage to be established by balance of leakage currents to the minimum leakage through the bit line. Advantageously, allowing the bit line voltage to float in standby minimize bit line leakage. For an embedded SRAM in standby, the present invention controls the bit line voltage and the supply voltage so as to minimize or reduce IDDQ leakage current. The controller reduces a voltage differential between supply voltage Vdd and a voltage reference Vss in the standby mode. In one embodiment, the bit line may be tied to the reference voltage Vss, and a time delay may be introduced to reduce the possibility of using more charge in switching than saved.

DETAILED DESCRIPTION OF THE PREFERRED EMBODIMENT

Figure 1:
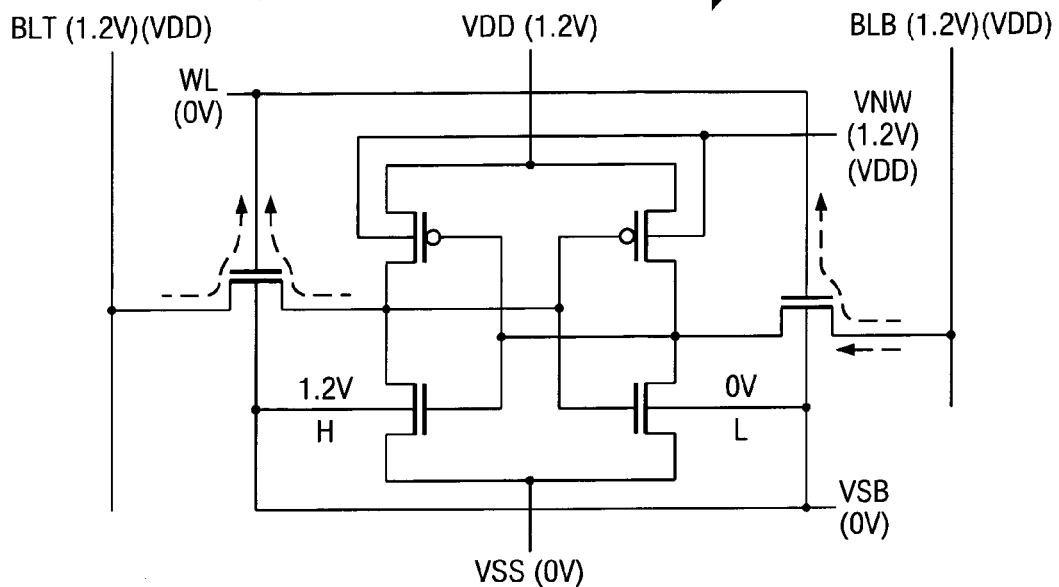
FIG. 1 is a schematic of a conventional SRAM cell with the bit lines pulled high to Vdd in standby.
Figure 2:
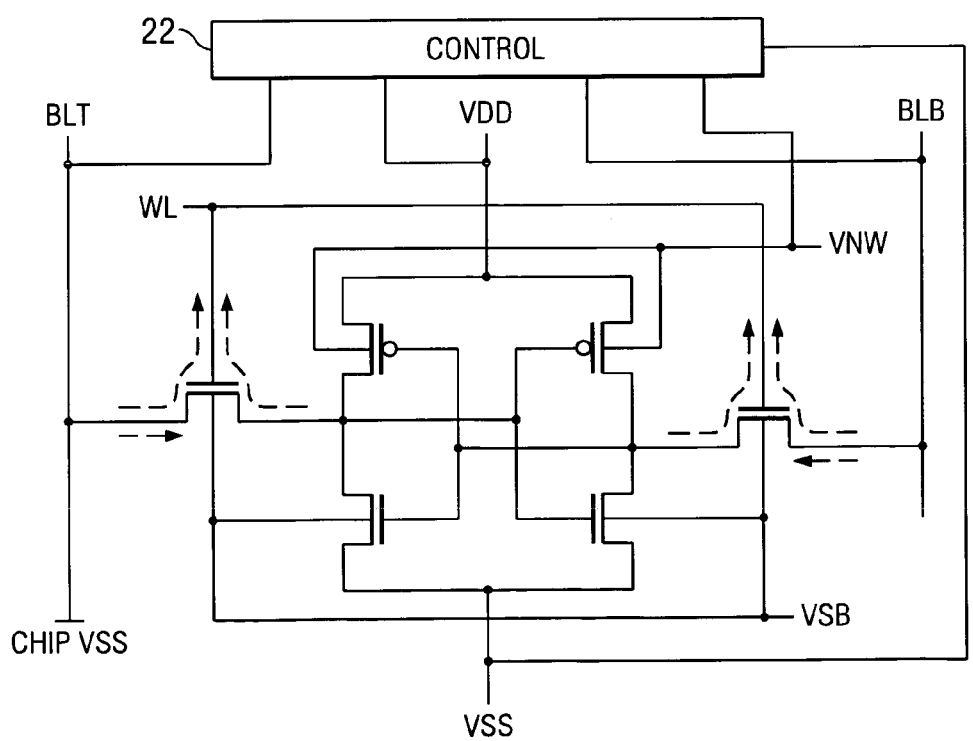
FIG. 2 is a schematic of a first preferred embodiment of the present invention with the array Vss raised and the array Vdd lowered.
Figure 3:
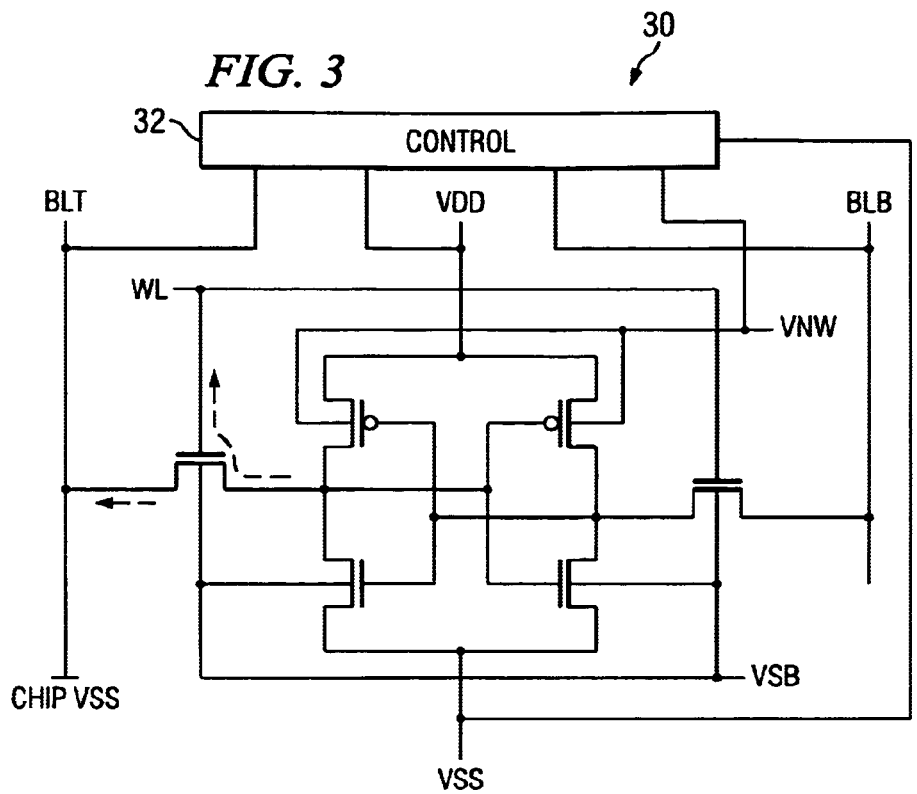
FIG. 3 is a schematic of a second preferred embodiment of the present invention with the array Vss raised but the array Vdd is not lowered.

Referring now to FIG. 2 and FIG. 3 there are shown at 20 and 30, respectively, SRAM cell embodiments according to the present invention with the various bias conditions of the SRAM cells 20 and 30 during standby. As shown in the embodiment of FIG. 2, the array VSS (VSSM) is raised and the array VDD (VDDM) is lowered. As shown in the embodiment of FIG. 3, the array VSS (VSSM) is raised but the array VDD is not lowered. In both embodiments, the array voltage Va, defined as the voltage across the array, namely, array VDD minus array VSS, is advantageously reduced to suppress the array leakage during standby. For further leakage reductions during standby, in another embodiment the n-well (Vnwell) can advantageously be biased higher, such as at 1.8V instead of 1.2V, and the word line (WL) can be biased at VSSM instead of VSS.

To achieve additional leakage reductions according to the embodiments of this invention, the bit line (BLT/BLB) can be left floating instead of being held at VDD. Table 1 shows the leakage reduction factors for various embodiment designs, bias conditions, and temperature corners of the SRAM array 20 and 30, where bit line BLT and BLB are always at the same voltage level. It can be seen that at high temperature an additional leakage reduction factor of up to 4 can be achieved by letting the bit line float. At room temperature, the impact of the floating bit line on leakage is even more significant.

TABLE 1

| Embodiment | Vnwell | WL | BL | T = 27 C. Va = .4 V Va = .5 V | | T = 105 C. Va = .4 V Va = .5 B | |
|---|---|---|---|---|---|---|---|
| FIG. 2 | 1.2 V | VSS | VDD | 4 | 4 | 6 | 6 |
| | | | Float | 32 | 19 | 24 | 16 |
| | | VSSM | VDD | 19 | 15 | 14 | 12 |
| | | | Float | 65 | 34 | 28 | 19 |
| | 1.8 V | VSS | VDD | 4 | 4 | 6 | 5 |
| | | | Float | 32 | 19 | 29 | 19 |
| | | VSSM | VDD | 19 | 15 | 16 | 14 |
| | | | Float | 66 | 34 | 36 | 25 |
| FIG. 3 | 1.2 V | VSS | VDD | 3 | 3 | 4 | 4 |
| | | | Float | 9 | 8 | 9 | 8 |
| | | VSSM | VDD | 46 | 25 | 18 | 13 |
| | | | Float | 61 | 33 | 20 | 15 |
| | 1.8 V | VSS | VDD | 3 | 3 | 5 | 4 |
| | | | Float | 9 | 8 | 12 | 10 |
| | | VSSM | VDD | 49 | 26 | 41 | 25 |
| | | | Float | 67 | 34 | 51 | 31 |

1. Compared with the standard design/bias with N75 mv/P100 mv Vt shift
2. Va, VSSM, and VDDM were controlled by voltage sources Table 2 shows the high temperature leakage current distribution of the SRAM cell 20 where Vnwell=1.2V, and Va=0.4V. It is shown that the gate tunneling leakage (mainly from the bit line to the word line) of the passgate is a significant portion of the array leakage during standby if the bit line is held at VDD. With the bit line floating, this portion of leakage is significantly reduced. The impact of leakage reduction with the bit line floating is even more significant at room temperature.

TABLE 2

| WL | BL | Ig_pass | Ig_driv | Ig_load | Ich |
|----|----|---------|---------|---------|-----|
| VSS | VDD | 82% | 2% | 2% | 14% |
|  | Float | 35% | 11% | 7% | 47% |
| VSSM | VDD | 38% | 7% | 5% | 50% |
|  | Float | 5% | 13% | 8% | 74% |

Figure 4:
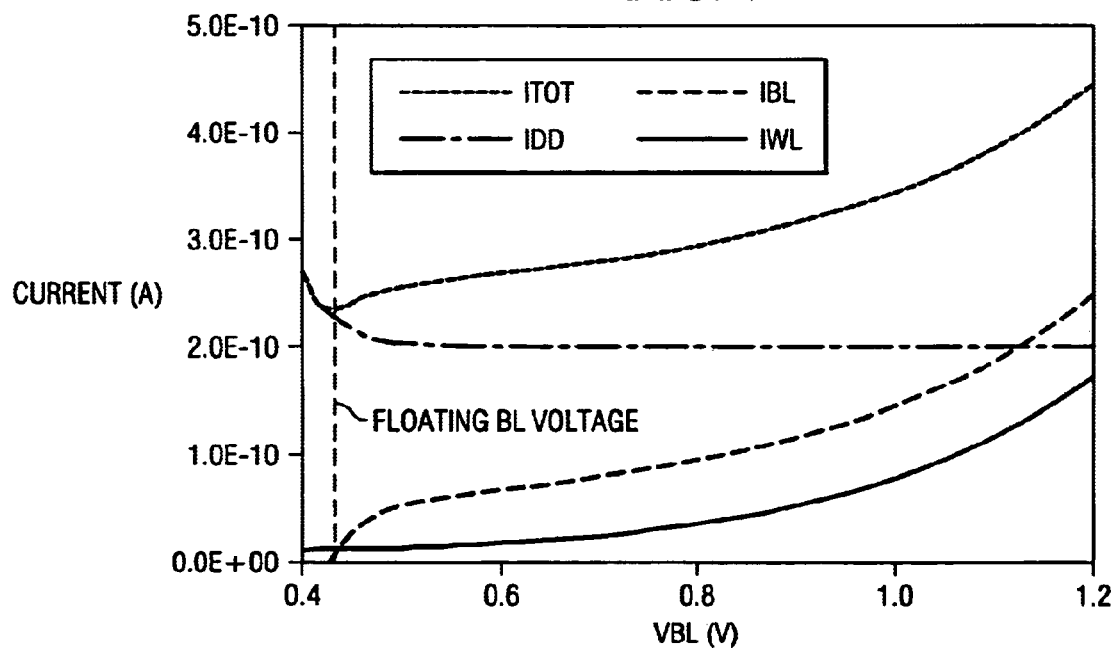
FIG. 4 is a plot of the SRAM cell leakage as a function of the bit line voltage of the embodiment of FIG. 2.

FIG. 4 shows the total SRAM cell 20 leakage ITOT (sum of pmos source current IDD and bit line current IBL) as a function of the bit line voltage VBL, with VSSM=0.4V, Va=0.4V, Vnwell=1.2V, Vw1=0.4V, and T=105C. It is shown that the array leakage is advantageously minimized when the bit line voltage is around 0.43V. The floating bit line voltage is also 0.43V. This confirms that the bit lines will advantageously "drift down" to a voltage level where the total array leakage is minimized. The graph also shows that the floating bit line voltage is near VSSM, which is 0.4V here.

Figure 5:
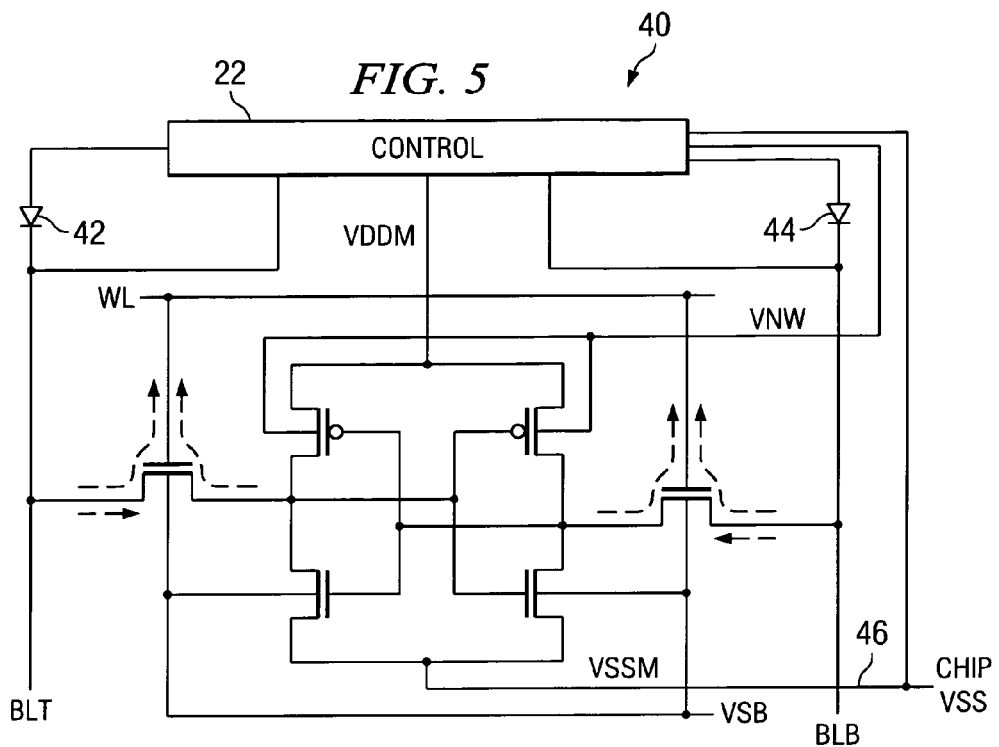

Care must be taken to avoid cell upset and to avoid increased leakage in transistors gated by the bit line. Cell upset could occur if the bit line voltage goes significantly (on the order of Vt) below the word line voltage. Thus, it is necessary to ensure that the BL voltage does not go significantly below the WL voltage. Leakage paths to below the WL voltage should be avoided. If the WL is held at chip Vss 46 (i.e. as shown in FIG. 5), this is not a problem, but if the array Vss is raised above chip Vss in standby and WL is raised along with array Vss, then the BL leakage to chip Vss must be reduced. The most common opportunity for BL leakage to chip Vss is in the WRITE circuitry. Advantageously, either the Vss WRITE circuitry can be raised along with WL Vss, or sufficient isolation between BL and WRITE Vss is ensured. As a further precaution, the range of the BL voltage can be limited, e.g. by diode connections 42, 44 as shown in SRAM cell 40 in FIG. 5.

The probability of upset will also be increased if there is a significant voltage difference between bit and bit-bar to a cell. With the bit lines floating, a voltage differential between bit and bit-bar will occur if the data stored is predominately 1's or predominately 0's in the associated column. Advantageously, to avoid the possibility of a significant voltage differential on the bit lines, bit and bit-bar are connected to float together when in standby. The connection of bit and bit-bar in standby also decreases the possibility of either going below WL.

Another possibility for cell upset occurs in the transition from standby to active. The bit lines must be restored to precharge high before WL is enabled.

Simulations show that bit line will float to near the array Vss, so as an alternative preferred embodiment to floating the bit lines, switching the bit lines to array Vss comes close to the minimum bit line leakage that can be obtained by floating. Advantageously, switching the bit lines from Vdd in active to array Vss in standby avoids concerns for floating bit lines while reducing standby IDDQ significantly, but adds to switching power consumed. Note that if array Vss is raised from periphery Vss in standby, lowering the bit line voltages to periphery Vss would result in significantly higher IDDQ than for bit lines at array Vss. If there may be frequent transitions between standby and active, this switching power embodiment may negate the savings in standby IDDQ. It is noted that the large capacitance of the bit lines, and thus the large CV**2f associated with changing bit line voltage, has generally deterred designers from considering changing bit line voltage to reduce IDDQ. But, by floating bit lines in standby as detailed in the first embodiment, the charge consumed in restoring the high bit line voltage will never be greater than the charge saved while floating, and will generally be less. To reduce the possibility of using more charge in switching than charge saved for case of switching to array Vss instead of floating, there may be introduced by controller 22 and 32 a time delay between turning off the connection of bit line to Vdd and turning on the connection of bit line to array Vss, such as 1 micro second. In the interim, the bit lines will float, and the leakage current will lower the bit line voltage. Having the delay time approximately match the time that it takes for the bit line voltage to float down to the leakage equilibrium value will approximately minimize the charge used in switching the bit line voltage while still providing a clamp on the bit line voltage for longer standby duration. In a noisy environment, such as with switching signal lines running over the SRAM array, it may be desirable to have a shorter delay.

Figure 6:
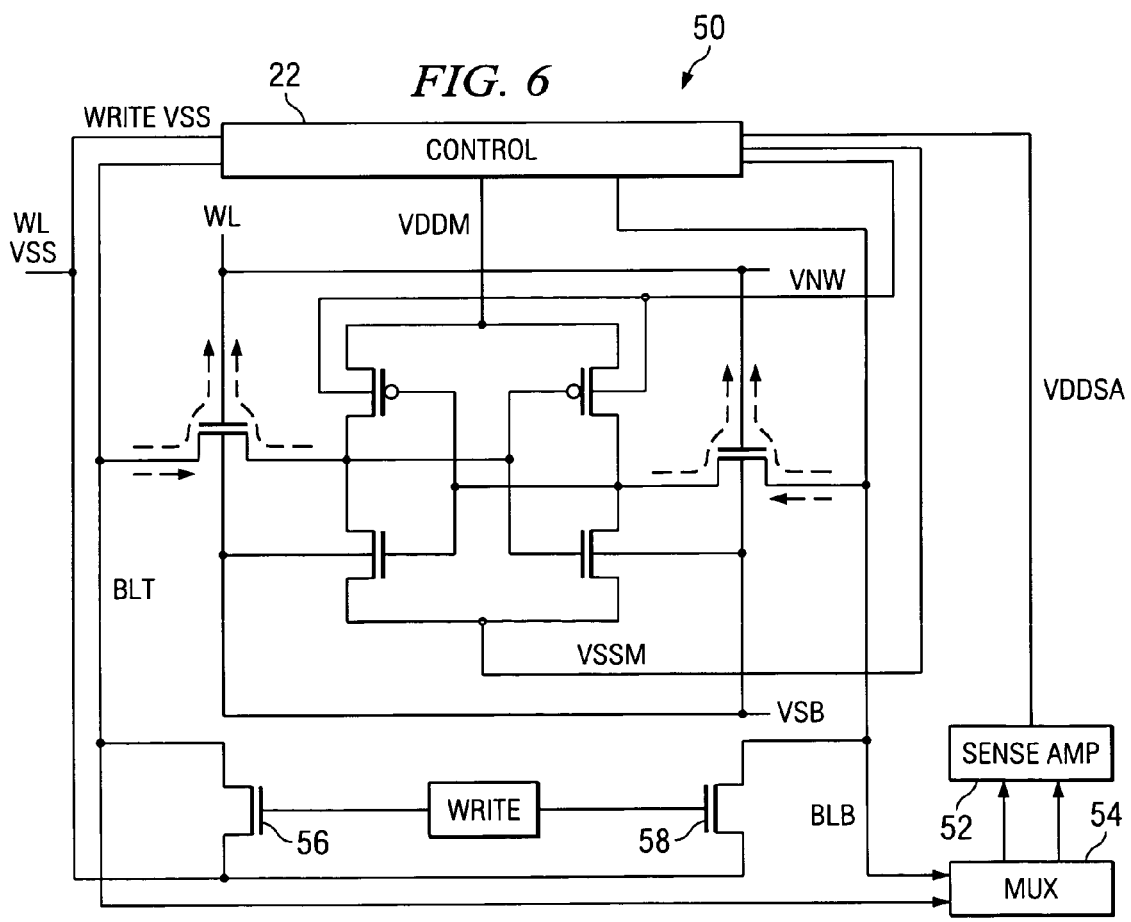

Associated with floating bit lines or switching the bit lines to array Vss, it is also necessary to ensure that the circuits gated by the bit lines, e.g. sense amps 52 (shown in FIG. 6), are in a low power state when bit lines are at or near array Vss. Generally, floating or reducing the bit line voltage will reduce leakage in the associated MUX 54 and WRITE transistors 56, 58 (see SRAM cell 50 in FIG. 6). Shutting off power in standby to the sense amps associated with the floating or lowered voltage bit lines will eliminate that source of possible power loss caused by the lowered bit line voltage.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A memory device, comprising:
   a sequential circuit memory cell adapted to store data and having a word line and a bit line; and
   a control adapted to reduce the memory cell leakage current by controlling a voltage on the bit line when the memory cell is in standby and the word line voltage level is at least a chip reference voltage;
   wherein the control is also adapted to reduce a leakage current between the word line and the bitline.

2. The memory device as specified in claim 1 wherein the control is adapted to permit the voltage of the bit line to float.

3. The memory device as specified in claim 1 wherein the bit line comprises a pair of bit lines.

4. The memory device as specified in claim 3 wherein the pair of bit lines are electrically connected to each other to have substantially equal voltages in standby.

5. The memory device as specified in claim 4 wherein the control is adapted to permit the substantially equal voltages of the pair of bit lines to float during standby.

6. The memory device as specified in claim 1 wherein the control is adapted to precharge the bit line.

7. The memory device as specified in claim 6 wherein the control is adapted to impose a voltage on the bit line in standby different from the pre-charge voltage in active.

8. The memory device as specified in claim 7 wherein the control is adapted to impose a voltage on the bit line substantially equal to the voltage on the word line in standby.

9. The memory device as specified in claim 7 wherein the control is adapted to impose a voltage on the bit line substantially equal to an array Vss.

10. The memory device as specified in claim 7 wherein a time delay is introduced upon entering standby prior to imposing a changed voltage on the bit line in standby.

11. The memory device as specified in claim 7 wherein the control is adapted to allow the bit line voltage to float prior to imposing the voltage in standby.

12. The memory device of claim 1 wherein following a standby condition, the control is adapted to impose a pre-charge voltage on the bit line substantially prior a word line enable, where said pre-charge voltage is different from the voltage on the bit line in standby.

13. The memory device as specified in claim 1 further comprising a sense amplifier and a supply voltage wherein the sense amplifier is electrically connected to the bit line, and wherein the sense amplifier is disconnected from the supply voltage during standby.

14. The memory device as specified in claim 1 wherein the memory cell comprises at least one PMOS device, further wherein the control is adapted to raise a voltage to a n-well of the PMOS device during standby.

15. The memory device as specified in claim 1 further comprising a device limiting a range of possible bitline voltages.

16. The memory device as specified in claim 15 wherein the device is a diode.

17. The memory device as specified in claim 1 wherein the memory device is disposed on a chip having the chip reference voltage, wherein the chip reference voltage is raised with the memory device reference voltage during standby.

18. The memory device as specified in claim 1 wherein the memory cell is disposed on a chip, further comprising a circuit limiting how far a voltage on the bitline can go below a voltage on the word line.

19. The memory device as specified in claim 17 wherein the word line voltage is held to the chip reference voltage.

* * * * *